(12) United States Patent
Echigo et al.

(10) Patent No.: US 6,546,624 B2
(45) Date of Patent: Apr. 15, 2003

(54) REMOVABLE FILM, A SUBSTRATE WITH FILM, A PROCESS FOR FORMING THE REMOVABLE FILM AND A PROCESS FOR THE MANUFACTURING OF THE CIRCUIT BOARD

(75) Inventors: Fumio Echigo, Osaka (JP); Hideki Higashitani, Kyoto (JP); Daizo Andoh, Osaka (JP); Noritake Fukuda, Tokyo (JP); Yasuhiro Nakatani, Osaka (JP); Tadashi Nakamura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 189 days.

(21) Appl. No.: 09/734,593

(22) Filed: Dec. 13, 2000

(65) Prior Publication Data

US 2002/0029906 A1 Mar. 14, 2002

(30) Foreign Application Priority Data

Dec. 16, 1999 (JP) ............................................ 11-357063
Mar. 10, 2000 (JP) ......................................... 2000-066858

(51) Int. Cl.⁷ ................................................ H01K 3/10
(52) U.S. Cl. ........................... 29/852; 29/846; 264/400; 427/505; 216/13; 216/17
(58) Field of Search ........................... 29/852, 846, 847, 29/848, 849, 850, 851; 264/400; 216/17, 65, 13, 20, 16, 18, 19; 427/505

(56) References Cited

U.S. PATENT DOCUMENTS 5,169,678 A * 12/1992 Cole et al. .................. 427/555
5,841,099 A    11/1998 Owen et al.
6,203,652 B1 * 3/2001 Egitto et al. ................. 156/247

* cited by examiner

Primary Examiner—David J. Walczak
(74) Attorney, Agent, or Firm—McDermott, Will & Emery

(57) ABSTRACT

Removable mask films 303 are formed on the both sides of the substrate having the adhesive layer 302 by applying and drying a resin varnish 304 including a ultraviolet-absorbing agent, and fine through holes 306 are formed by using a third harmonics YAG solid-state laser light with a relatively short wavelength not longer than that in the ultraviolet range in such a way that the effects of such a residual strain as the conventional embodiment forming a removable mask film by a laminating process may be decreased as well as the more fine hole drilling compared with conventional embodiment using the carbon dioxide gas laser with a relatively long wavelength may be performed.

18 Claims, 12 Drawing Sheets

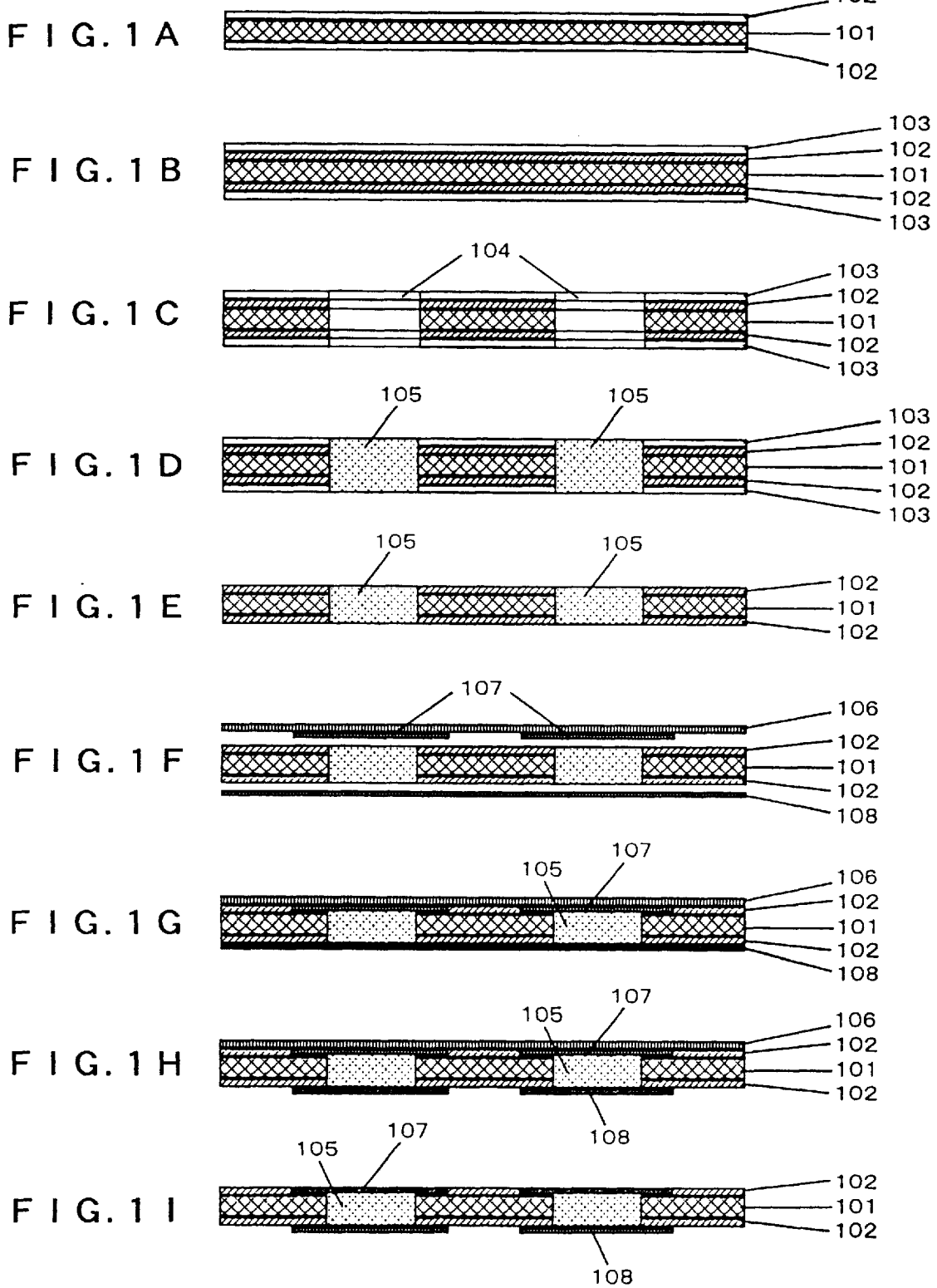

F I G. 2 A 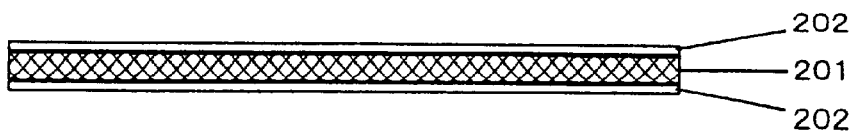
F I G. 2 B 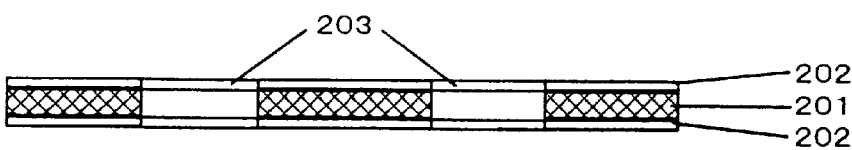
F I G. 2 C 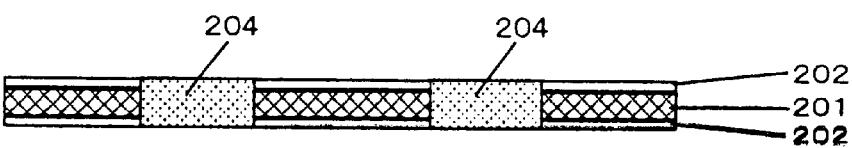
F I G. 2 D 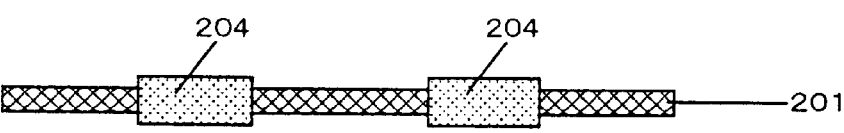
F I G. 2 E 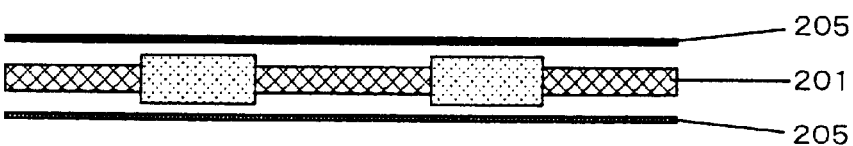
F I G. 2 F 
F I G. 2 G 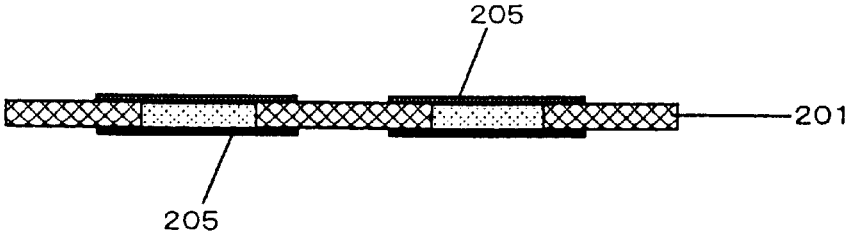

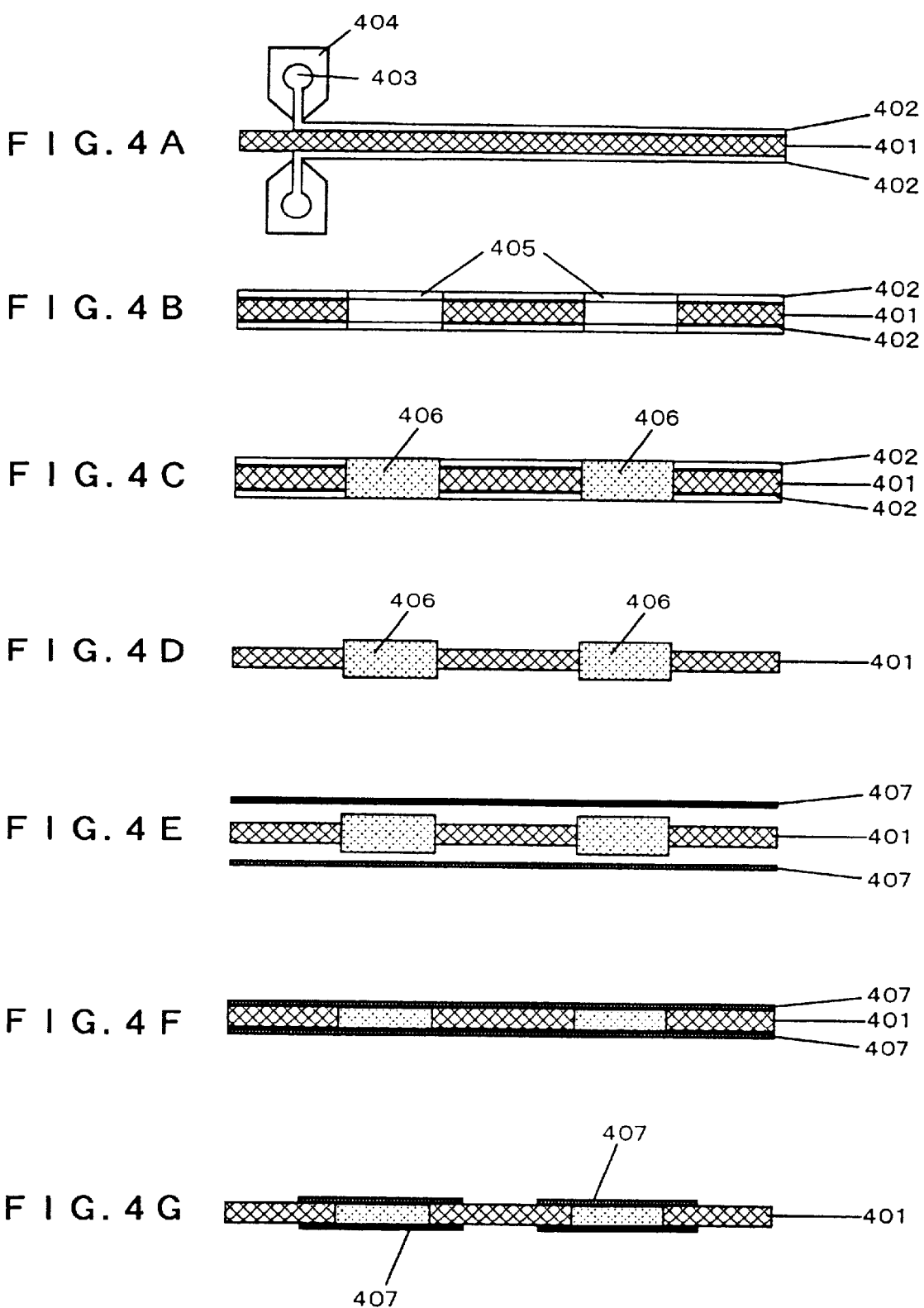

REMOVABLE FILM, A SUBSTRATE WITH FILM, A PROCESS FOR FORMING THE REMOVABLE FILM AND A PROCESS FOR THE MANUFACTURING OF THE CIRCUIT BOARD

BACKGROUND OF THE INVENTION

1. Field of the Invention

The present invention relates to a process for the manufacturing of a circuit board which interconnects at least two circuit patterns, a removable film suitable for a process for the manufacturing of the circuit board, a substrate with film and a process for forming the removable film.

2. Description of the Related Art

As electronic equipment, in recent years, downsize and become denser starting with information-telecommunication, a circuit board is deeply required to brought to the multilayer not only in the field of the industrial use but also in the field of the consumer use. It is required in multilayered circuit board to develop an interconnection structure contacting through interstitial via hole between a plurality of circuit patterns. Further, it is required to develop a structure and a process with a high degree of reliability in a structure of interstitial via hole contact and a process for preparing its structure.

The present applicant proposed a novelly configured circuit board interconnecting between layers through a interstitial via hole by conductive paste and a novel process for preparing the circuit board.

A process for the manufacturing of the circuit board is composed as follows.

That is, a process for the manufacturing of the circuit board is composed, comprising:

a procedure for pasting removable mask film to porous insulating substrate consisting of a composite material of nonwoven fabric and thermosetting resin and having compressibility and providing a through hole in the substrate;

a procedure for filling conductive paste into said through hole;

a procedure for removing said film from said substrate with film filled with conductive paste;

a procedure for bonding metal foil to a face removed of film of said substrate; and a procedure for compressing said substrate bonded with said metal foil by heating and pressuring.

In such a process for the manufacturing of the circuit board, carbon dioxide gas laser is generally used in drilling porous insulating substrate including removable mask film for providing through hole.

However, carbon dioxide gas laser is not easy to focus and hard to reduce the focus spot since a wavelength of laser light is relatively as long as 10.6 $\mu$m. Furthermore, since a wavelength of laser light exists in a range of infra-red rays, through hole is enlarged due to the thermal effects of laser. Therefore, it is difficult to form through holes, for example, as fine as the diameter of 50 $\mu$m and this poses the barrier for realizing a circuit board of fine interconnection design.

Further, in a process for the manufacturing of a circuit board described above, a removable mask films are pasted to the porous insulating substrate by thermal laminating process. Further, hole drilling is performed on a porous insulating substrate with removable mask films by utilizing laser processing and the like. Furthermore, conductive paste is filled into the drilled holes and thereafter the removable the mask film is removed.

In such a process, it is in a condition that strain developed by heat, pressure and film tension in laminating remains in said substrate. When removable film is removed from said substrate under this condition, said residual strain is released from said film and drilled holes result in a deviation from the hole positions at drilling. This causes a significant problem particularly in the case required for narrow hole pitch and fine dimensional accuracy, that is, in realizing a circuit board of fine interconnection design.

SUMMARY OF THE INVENTION

Therefor, it is an principal object of the present invention to provide a process for the manufacturing of a circuit board which may realize a circuit board of fine interconnection design as well as to provide a removable film suitable for a process for the manufacturing of the circuit board, a substrate with film and a process for forming the removable film.

It is another object of the present invention to provide a circuit board which protects a drilled hole from being filled together with scraping and dust generated during drilling in filling conductive paste into the drilled hole and enables via hole contact of low initial resistance and high interconnection reliability.

To accomplish objectives described above, the present invention, in short, employs removable mask film absorbing laser light of wavelength not longer than that in the ultraviolet range. Thus, hole drilling may be performed by using laser light of wavelength not longer than that in the ultraviolet range in which laser beam is easy to focus more and fine hole drilling may be performed.

Further, said substrate is preferably a film substrate having optical absorptivity upon laser light of wavelength not longer than that in the ultraviolet range and adhesion or preferably a porous substrate having optical absorptivity upon laser light of wavelength not longer than that in the ultraviolet range and compressibility. Thereby, it becomes that fine hole drilling may be performed on a substrate and removable film at one time by using laser light of wavelength not longer than that in the ultraviolet range.

Further, a removable film preferably contains a ultraviolet-absorbing agent. Thereby, it becomes that a removable film may absorb laser light with a wavelength not longer than that in the ultraviolet range by addition of a ultraviolet-absorbing agent even though a principal material composing a removable film does not have a absorption characteristic of ultraviolet light.

Further, a removable film is preferably cellulosic, such as nitro cellulose, acethyl cellulose, cellulose acetate, cellulose propionate, ethyl cellulose and the like. Thereby, it becomes that a removable film may be formed by using cellulosic having the good ability of the film to be formed and the good solubility into the solvent.

Further, preferably, said removable film is formed by applying and drying a resin varnish, which exerts removability after drying and has optical absorptivity upon laser light in a range of wavelength not longer than that in the ultraviolet range, on the surface of the substrate. In conventional embodiments forming removable mask films on substrates by thermal laminating process, a residual strain develops in the substrate due to heat, pressure and film tension in laminating and the residual strain is thereafter released in removing the films to result in a dimensional deviation. On the contrary, in the present process using a resin varnish, such a dimensional deviation will be improved.

Further, a removable film is preferably polyethylene naphthalate (PEN), polyamide or polyimide.

Further, said resin varnish preferably contains a solvent not eroding said substrate. Thereby, the removable film will be able to be formed on the substrate without eroding the substrate.

Further, a plurality of removable films are preferably laminated and provided on a substrate. Thereby, a superficial removable film may be removed after hole drilling, and scraping generated in hole drilling and dust deposited during a processing may be removed together with a removable film removed. Thereby, a drilled hole is protected from being contaminated with scraping and dust during filling a conductive element into the drilled hole. Therefore, a circuit board having via hole contact of low initial resistance and high interconnection reliability may be obtained. Furthermore, since at least one removable film is left on the side of the substrate after a superficial removable film is removed, the removable film functions as a mask film in filling the conductive element and therefore a surface of a insulating resin sheet is not contaminated with the conductive element.

BRIEF DESCRIPTION OF THE DRAWINGS

Other and further objects of this invention will become obvious upon an understanding of the illustrative embodiments about to be described or will be indicated in the appended claims, and various advantages not referred to herein will occur to one skilled in the art upon employment of the present invention in practice.

FIGS. 1A-1I are sectional views of the steps illustrating a process for the manufacturing of a circuit board in the first preferred embodiment of the present invention;

FIGS. 2A-2G are sectional views of the steps illustrating a process for the manufacturing of a circuit board in the second preferred embodiment of the present invention;

FIGS. 4A-4G are sectional views of the steps illustrating a process for the manufacturing of a circuit board in the fourth preferred embodiment of the present invention;

DETAILED DESCRIPTION OF THE INVENTION

Figure 3A:
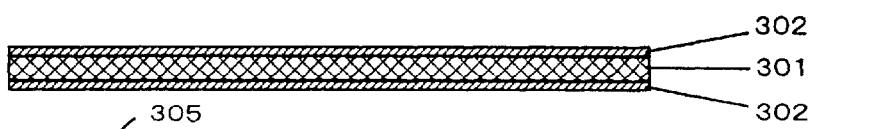
FIGS. 3A-3I are sectional views of the steps illustrating a process for the manufacturing of a circuit board in the third preferred embodiment of the present invention.

In the following are described preferred embodiments of the present invention taken in connection with drawings.
First Preferable Embodiment FIG. 1 are sectional views of the steps illustrating a process for the manufacturing of a circuit board according to the first preferred embodiment of the present invention.

At first, as shown in FIG. 1A, electrical insulating film 101 having the adhesive layers 102 on both sides is prepared as a substrate. Film 101, for example, may be selected from a group of polyimide film, aramid film, poly(p-phenylene benzobisoxazole) film, total aromatic polyester base liquid crystal polymer, and the like. Adhesive, for example, such as epoxy base, modified polyimide base, silicon base and the like may be used as the adhesive layer 102. In any kind of adhesive, adhesive is brought to half-cured condition to ensure the ability of interconnection layer 107 to be buried in heating and pressuring as described hereinafter.

An example of film 101 will be named. For example, "KAPTON" (Du Pont-Toray trademark), "UPILEX" (Ube Industries Ltd. trademark), "APICAL" (Kaneka Corporation trademark) are named as film 101 comprising polyimide film. With these products, water-absorbing capacity may be selected by modifying the kind of the products and film of low water-absorbing power is also available.

For example, "Aramica" (Asahi Chemical Industry Co., Ltd. trademark), "MICTRON" (Toray Co., Ltd. trademark) and "Technora" (Teijin Ltd.) are named as film 101 comprising aramid film. These aramid film is higher in rigidity and more resistant to stretching compared with polyimide film.

For example, "Zylon" (Toyobo Co., Ltd. trademark) is named as film 101 comprising poly(p-phenylene benzobisoxazole) film. This film has heat-resistance, high elasticity and low water-absorbing power.

For example, "Vectra" (Poly Plastic trademark) is named as film 101 comprising total aromatic polyester base liquid crystal polymer. This film is less in heat-resistance but less in water-absorbing and better in a dielectric characteristic.

In this embodiment, film "UPILEX" in thickness of 12.5 $\mu$m as a film 101 and adhesive of modified polyimide base as an adhesive layer 102 are used respectively. Modified polyimide base resin is brought to the half-cured condition by drying after applying to ensure the ability of a pattern to be buried. A thickness of the adhesive layer 102 is set to 5 $\mu$m respectively on each side.

Then, as shown in FIG. 1B, the removable mask films 103 are formed on the both sides of the film 101 having the adhesive layers 102. Herein, the removability which a mask film has means a degree of removability such that a mask film 103 may be removed from a film 101 as a substrate without fracturing a mask film.

A film absorbing laser light with wavelength not longer than that in the ultraviolet range, laser light with wavelength of 400 nm or less in this embodiment, is used as the mask film 103. There are, for example, polyethylene naphthalate (PEN), polyamide film, polyimide film and the like as such a film.

Or, a film composed with a ultraviolet-absorbing agent added may also be used other than said film materials. A publicly known ultraviolet-absorbing agent starting with a class of benzotriazole or benzophenone may be used as the ultraviolet-absorbing agent.

There are, for example, 2-(2'-hydroxy-5'-methyl phenyl)-benzotriazole, 2-(2'-hydroxy-3'-tert-butyl-5'methyl phenyl)-5-chlorobenzotriazole and 6-(2-benzotriazole)-4-t-octyl-6'- t-butyl-4'-methyl-2, 2'-methylene bisphenol and the like as the ultraviolet-absorbing agent consisting of a class of benzotriazole.

There are 2, 2'-dihydroxy-4, 4'-dimethoxy-benzophenone, 2, 2', 4, 4'-tetrahydroxy-benzophenone and the like as the ultraviolet-absorbing agent consisting of a class of benzophenone.

And, each mask film 103 is provided with a silicon base releasing layer on the side bonded to the film 101 as required.

In this embodiment, a polyethylene naphthalate (PEN) film with a thickness of 9 $\mu$m is used as mask films 103.

There are a laminating process and a pressing process as method for pasting the mask film 103 to the film 101 having the adhesive layer 102. In this embodiment, a laminating process is adopted. Laminating is performed at a temperature of the order of 130° C. This processing allows a surface of the adhesive layer 102 to be melted a little and the mask film 103 to be pasted to the film 101.

Through holes 104 are in turn formed by laser processing in the film 101 having mask films 103 and layers of adhesive 102 respectively at both sides of the film as shown in FIG. 1C. In this embodiment, a short-wavelength laser in which laser beam is easy to focus more is utilized as laser light used for laser processing. Specifically, a third harmonics YAG solid-state laser radiating laser light with a wavelength of 351 nm being not longer than that in the ultraviolet range is used.

An adhesive layer 102 and a film 101 have a characteristic to absorb laser light with a wavelength in the ultraviolet range. And, a mask film 103 has a characteristic to absorb laser light with a wavelength of 400 nm or less. Therefore, through holes 104 as fine as the diameter of 50 $\mu$m may be formed with a high forming precision by forming through holes 104 using a third harmonics YAG solid-state laser light with a wavelength of 351 nm.

Then, as shown in FIG. 1D, conductive paste 105 is filled into the through holes 104. In this embodiment, the conductive paste 105 is filled by printing the conductive paste directly from on the mask film 103 by a screen printing machine. In this time, a resin ingredient in the conductive paste 105 within the through holes 104 is drawn by evacuating and absorbing through a porous sheet (not shown) such as Japanese paper and the like from the opposite side to the printed face under vacuum. The conductive paste 105 is increased in a percentage of a conductive element by this operation and further closely filled.

When such procedures are performed, the mask film 103 plays roles as a printing mask and a protector against contamination of the surface of the adhesive layer 102.

Then, as shown in FIG. 1E, the mask films 103 are removed from the both sides of the film 101. In this procedure, an effect of a portion of a hole end is not negligible in removing since the through holes 104 are as fine as a diameter of 50 $\mu$m. That is, the conductive paste 105 within the through holes 104 is rifled more or less together with the mask film 103. And, since a diameter of the through holes 104 is fine, a amount of the rifled paste thereof comes to relatively considerable amount.

In this case, though a shape of the remaining conductive paste 105 takes a wide variety of forms, the paste is not rifled below the surface of the adhesive layer 102. The remaining conductive paste 105 is flush with the adhesive layer 102 even at the worst. A phenomenon that conductive paste 105 is thus taken away through removing the mask film 103 (hereinafter, referred to as "phenomenon of the paste being taken away") is brought to the fore from and under 100 $\mu$m in a diameter of the through hole.

Further, in FIG. 1E, a change of the dimensions of film 101 was 50 to 80 $\mu$m relative to a reference distance of 60 mm after the mask filter 103 was removed.

Then, as shown in FIG. 1F, an interconnection layer 107 supported by a supporting substrate 106 and a copper foil 108 are overlaid respectively on the both sides of the film 101. In overlaying procedure, both of the them are overlaid in such a way the interconnection layer 107 is at least located directly above the through hole 104 filled with conductive paste 105. And, both of them overlaid are heated and pressurized. Heating and pressurizing is carried out, for example, by using vacuum press.

The adhesive layer 102 is fluidized by these heating and pressurizing, and the interconnection layer 107 is buried into the adhesive layer 102 as shown in FIG. 1G. The conductive paste 105 within the through holes 104 is compressed by that the interconnection layer 107 is buried into the adhesive layer 102 like this, and therefore a resin ingredient in the conductive paste 105 flows out into the adhesive layer 102 and a conductive element in the conductive paste 105 is closely packed. Thus, the interconnection layer 107 and the copper foil 108 which are located on the opposite sides of the film 101 are electrically interconnected through the intermediary of conductive paste 105. Hereafter, the adhesive layer 102 and the conductive paste 105 are cured.

Then, as shown in FIG. 1H, the copper foil 108 is patterned into desired interconnection form using photolithography. In this embodiment, a foil in 9 $\mu$m thickness is utilized for the copper foil 108.

At the last step, the supporting substrate 106 is removed leaving the interconnection layer 107 buried into the adhesive layer 102 as shown in FIG. 1I. Thus, a circuit board having the interconnections on the both sides is completed. In this embodiment, aluminum foil is used for the supporting substrate 106 and copper foil (patterned) in 9 $\mu$m thickness is utilized for the interconnection layer 107.

Removing the supporting substrate 106 is performed by dissolving and removing the supporting substrate 106 by selective etching between aluminum and copper foils. Other than selective etching, there is also a method of removing the supporting substrate 106 by heating with releasing foam sheet provided between the supporting substrate 106 and the interconnection layer 107. In this method, the supporting substrate 106 is not limited to the aluminum foil, and metal foil and metal plate of materials such as copper, stainless and the like may be utilized.

Further, in this embodiment, a multilayer interconnection board may be formed by treating products prepared by the procedure of FIG. 1A to FIG. 1H as the interconnection layer 107 supported by the supporting substrate 106 in FIG. 1F and by repeating the procedures of FIG. 1F to FIG. 1H.

In accordance with this embodiment, fine through holes 104, for example, such as the diameter of 50 $\mu$m may be formed because holes are drilled by using a YAG solid-state laser radiating laser light with a short wavelength not longer than that in the ultraviolet range and therefore a high density circuit board having a fine via hole may be realized.

Second Preferable Embodiment

FIG. 2 are sectional views of the steps illustrating a process for the manufacturing of a circuit board in the second preferred embodiment of the present invention.

At first, as shown in FIG. 2A, the removable mask films 202 are formed on the both sides of the porous insulating substrate the 201 having compressibility. The porous insulating substrate 201 is, for example, prepared as follows. That is, thermosetting resin is impregnated into nonwoven fabric utilizing organic fiber. Thereby, porous insulating substrate 201 having voids inside and compressibility is prepared. Then, thermosetting resin impregnated is brought to the half-cured condition. And, publicly known heat-resistant fiber, for example, such as aromatic polyamide fiber, poly(p-phenylene benzobisoxazole) fiber, polybenzimidazole fiber or the like may be used as organic fiber. And, for example, epoxy resin, polyimide resin, phenol resin, fluororesin, cyanate ester resin or the like may be used as thermosetting resin.

In this embodiment, nonwoven fabric impregnated with epoxy resin which uses aromatic polyamide fiber is used as the porous insulating substrate 201. And, a thickness of the porous insulating substrate 201 is 120 µm.

A film absorbing laser light with wavelength of 400 nm or less in the range of wavelength not longer than that in the ultraviolet range is used as mask films 202. There are, for example, polyethylene naphthalate (PEN), polyamide film, polyimide film and the like as such a film.

Or, a film composed with a ultraviolet-absorbing agent added may also be used other than said film materials. The ultraviolet-absorbing agent described in the first embodiment may be used as an ultraviolet-absorbing agent. Further, mask film 202 may be provided with a silicon base releasing layer as required.

In this embodiment, a polyethylene naphthalate (PEN) film with a thickness of 9 µm is used for mask films 202. There are a laminating process and a pressing process as method for forming the mask films 202 on the both sides of the porous insulating the substrate 201. In this embodiment, a laminating process is adopted. Laminating is performed at a temperature of the order of 120° C. This processing allows a surface of the porous insulating substrate 201 to be melted a little and the the mask films 202 to be pasted.

Through holes 203 are in turn formed in the porous insulating substrate 201 provided with mask films 202 by laser processing as shown in FIG. 2B. In this processing, through holes 203 are formed by using a third harmonics YAG solid-state laser radiating laser light with a wavelength of 351 nm as well as the first embodiment described above.

The porous insulating substrate 201 has a characteristic to absorb laser light with wavelength in the ultraviolet range and a mask film 202 has also a characteristic to absorb laser light with a wavelength of 400 nm or less as described above. Therefore, through holes 203 may be formed by using a third harmonics YAG solid-state laser radiating laser light with a wavelength of 351 nm. In this embodiment, through holes 203 of the diameter of 100 µm are formed by using a laser light described above.

Then, as shown in FIG. 2C, conductive paste 204 is filled into the through holes 203. In this embodiment, the conductive paste 204 is printed directly from on the mask film 202 by a screen printing machine. In this time, a resin ingredient in the conductive paste 204 within the through holes 203 is drawn by evacuating and absorbing through a porous sheet (not shown) such as Japanese paper and the like from the opposite side to the printed face under vacuum. The conductive paste 204 is increased in a percentage of a conductive element by this operation and further closely filled.

When such procedures are performed, the mask film 202 plays roles as a printing mask and a protector against contamination of the surface of the porous insulating substrate 201.

Then, as shown in FIG. 2D, the mask films 202 are removed from the both sides of the porous insulating substrate 201. In this procedure, since a diameter of the through holes 203 are 100 µm, a phenomenon of "the paste being taken away" described in the first embodiment seldom occurs.

Further in this time, a change of the dimensions of the porous insulating substrate was 201 was 30 to 50 µm relative to a reference distance of 60 mm after the mask filter 202 was removed.

Then, as shown in FIG. 2E, copper foils 205 are overlaid respectively on the both sides of the porous insulating substrate 201. And, both of them overlaid are heated and pressurized. Heating and pressurizing is carried out, for example, by using vacuum press.

The conductive paste 204 within the through holes 203 is compressed and therefore a resin ingredient in the conductive paste 204 flows out into the porous insulating substrate 201 by these heating and pressurizing, as shown in FIG. 2F.

Thus, a conductive element in the conductive paste 204 is closely packed and the copper foils 205 which are located on the opposite sides of the porous insulating substrate 201 are electrically interconnected each other through the intermediary of conductive paste 204. Hereafter, the porous insulating substrate 201 and the conductive paste 204 are cured.

Then, as shown in FIG. 2G, the copper foil 205 is patterned into desired interconnection form using photolithography. In this embodiment, a foil in 18 µm thickness is utilized for the copper foil 205. Thus, a circuit board having the interconnections on the both sides is completed.

Further, in the second embodiment, a multilayer interconnection board may be formed by treating the circuit board prepared by the procedures of FIG. 2A to FIG. 2G as the copper foil on the one side in FIG. 2E and by repeating the procedures of FIG. 2E to FIG. 2G.

Third Preferable Embodiment

FIG. 3 are sectional views of the steps illustrating a process for the manufacturing of a circuit board in the third preferred embodiment of the present invention.

At first, as shown in FIG. 3A, electrical insulating film 301 having the adhesive layers 302 on both sides is prepared. Materials described in the first embodiment may be used as film 301 and adhesive layers 302. In this embodiment, film "UPILEX" in thickness of 12.5 µm as a film 301 and adhesive of modified polyimide base as an adhesive layer 302 are used respectively.

The adhesive layer 302 was brought to half-cured condition by drying after applying to ensure the ability of a pattern to be buried. A thickness of the adhesive layer 302 is set to 5 µm respectively on each side.

Figure 3B:
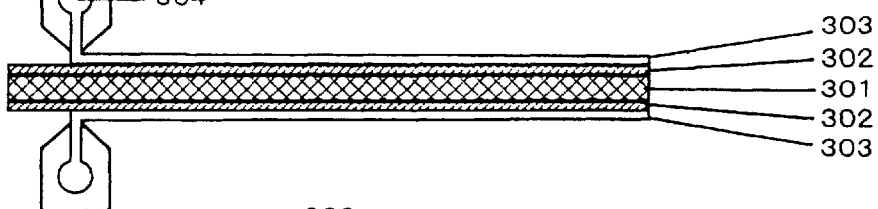

Then, as shown in FIG. 3B, the removable mask films 303 are formed on the both sides of the film 301. The mask films 303 are formed by applying and drying a resin varnish 304. The resin varnish 304 is composed of at least a resin to be a principal component of the mask film 303, a ultraviolet-absorbing agent and solvent. Cellulosic, for example, such as nitrocellulose, acethyl cellulose, cellulose acetate, cellulose propionate, ethyl cellulose and the like may be used for a resin to be a principal component of the mask film 303.

When the mask film 303 is formed as a principal component of cellulosic, a ultraviolet-absorbing agent described in the first embodiment is added in such a way that hole drilling may be performed by using laser light with short wavelength of 400 nm or less in the range of wavelength not longer than that in the ultraviolet range. Further, as for solvent composing of the resin varnish 304, it is selected such a solvent that dissolves the principal component composing of the mask film 303 and the ultraviolet-absorbing agent but does not erode the adhesive layer 302. Transformation of the foregoing material mixed into varnish may be achieved by using in combination adequately dispersion equipment using a media such as a ball mill, a sand mill or the like, kneading equipment such as a pressure kneader, a planetary mixer or the like and mixing equipment such as a disper or the like. The concentration and the viscosity of the resin varnish 304 may be determined corresponding to a application means.

The method for applying the resin varnish 304 on the film 301 is not limited, a publicly known method such as electrostatic coating, dip coating, spray coating, roller coating, doctor blade method, gravure method, die coating and screen printing etc may be adopted.

In this embodiment, the resin varnish 304 is prepared by mixing and dispersing materials having the following compositions.

Ethyl cellulose (ETHOCEL STD100:Dow Chemical Company)
100 parts by weight
Ultraviolet-absorbing agent (JF-77: Johoku Chemical Co., Ltd.) 1 parts by weight
Toluene 450 parts by weight
Ethanol 450 parts by weight After the adhesive layers 302 are formed on the both sides of the film 301, the mask films 303 are formed by applying a resin varnish 304 on the film 304. The resin varnish 304 is applied by die coating using a die nozzle 305. A thickness of the mask films 303 is adjusted to 10 $\mu$m after it is formed in such a way and then dried. Drying is performed at a temperature required for releasing the solvent e.g. the order of 100° C. Futher, the ultraviolet-absorbing agent in this embodiment (JF-77: Johoku Chemical Co., Ltd.) is composed of 2-(2'-hydroxy-5'-methyl phenyl)-benzotriazole to be a principal component.

Figure 3C:
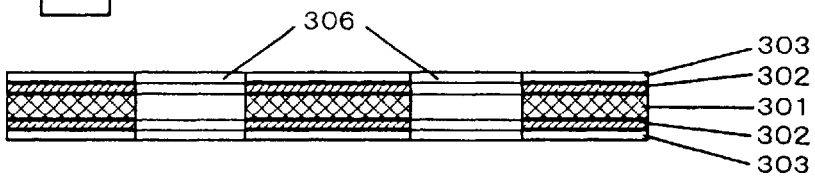

Through holes 306 are in turn formed in the film 301 having mask films 303 and layers of adhesive 302 respectively on the both sides of the film as shown in FIG. 3C. Through holes 306 are formed by laser processing.

In this embodiment, a third harmonics YAG solid-state laser radiating laser light with a wavelength of 351 nm being not longer than that in the ultraviolet range is used to perform a fine hole drilling as well as the first embodiment described above. An adhesive layer 302 and a film 301 have a characteristic to absorb laser light with a wavelength in the ultraviolet range and a mask film 303 has also a characteristic to absorb laser light with a wavelength of 400 nm or less as described above. Therefore, through holes 306 are formed by using a third harmonics YAG solid-state laser radiating laser light with a wavelength of 351 nm. In this embodiment, through holes 306 of the diameter of 50 $\mu$m are formed by using such a technique.

Figure 3D:
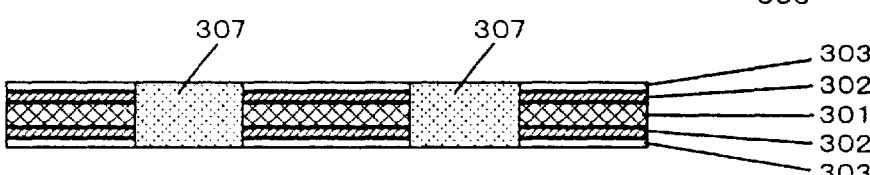

Then, as shown in FIG. 3D, conductive paste 307 is filled into the through holes 306. In this embodiment, the conductive paste 307 is filled by printing the conductive paste 307 from on the mask film 303 by a screen printing machine. In this time, a resin ingredient in the conductive paste 307 within the through holes 306 is drawn by evacuating and absorbing through a porous sheet (not shown) such as Japanese paper and the like from the opposite side to the printed face under vacuum. The conductive paste 307 is increased in a percentage of a conductive element by this operation and further closely filled.

When such procedures are performed, the mask film 303 plays roles as a printing mask and a protector against contamination of the surface of the adhesive layer 302.

Figure 3E:
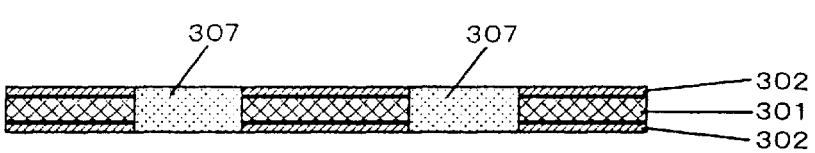

Then, as shown in FIG. 3E, the mask films 303 are removed from the both sides of the film 301. In this procedure, since the through holes 306 are as fine as a diameter of 50 $\mu$m, an effect of a portion of a hole end is not negligible and a phenomenon of "the paste being taken away" described in the first embodiment occurs.

Further, in FIG. 3E, a change of the dimensions of film 301 was within 10 $\mu$m relative to a reference distance of 60 mm after the mask filter 303 was removed.

While a change of the dimensions of film 101 was 50 to 80 $\mu$m relative to a reference distance of 60 mm in the first embodiment wherein the mask films 103 are formed on the both sides of the film 101 by a laminating process, effects of residual strain like laminating process is almost never found and the dimensional accuracy is significantly improved in this embodiment wherein the mask films 303 are formed by applying and drying a resin varnish 304.

Figure 3F:
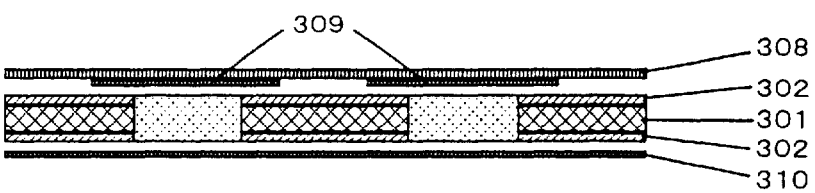

Then, as shown in FIG. 3F, an interconnection layer 309 supported by a supporting substrate 308 and a copper foil 310 are overlaid respectively on the both sides of the film 301. In overlaying procedure, both of the them are overlaid in such a way the interconnection layer 309 is at least located directly above the through hole 306 filled with conductive paste 307. And, both of them overlaid are heated and pressurized. Heating and pressurizing is carried out, for example, by using vacuum press.

Figure 3G:
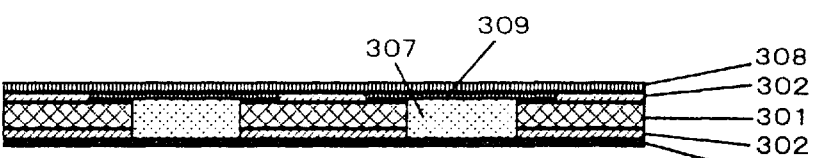

The adhesive layer 302 is fluidized and the interconnection layer 309 is buried into the adhesive layer 302 by these heating and pressurizing as shown in FIG. 3G. The conductive paste 307 within the through holes 306 is compressed by that the interconnection layer 309 is buried into the adhesive layer 302 like this, and therefore a resin ingredient in the conductive paste 307 flows out into the adhesive layer 302 and a conductive element in the conductive paste 307 is closely packed. Thus, the interconnection layer 309 and the copper foil 310 which are located on the opposite sides of the film 301 are electrically interconnected through the intermediary of conductive paste 307. Hereafter, the adhesive layer 302 and the conductive paste 307 are cured.

Figure 3H:
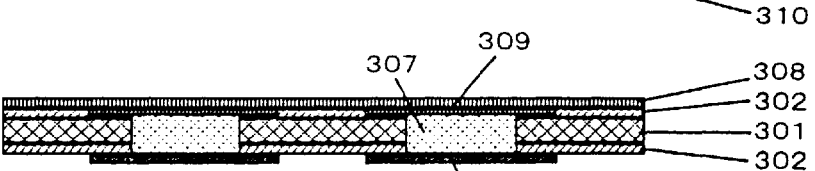

Then, as shown in FIG. 3H, the copper foil 310 is patterned into desired interconnection form using photolithography. In this embodiment, a foil in 9 $\mu$m thickness is utilized for the copper foil 310.

Figure 3I:
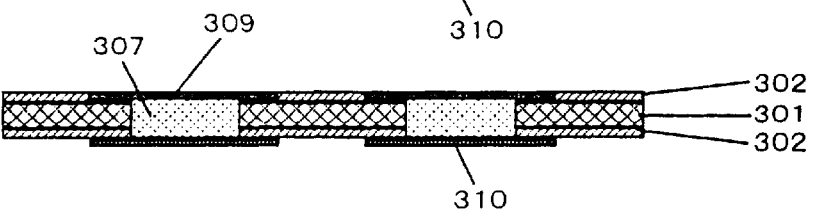

At the last step, the supporting substrate 308 is removed leaving the interconnection layer 309 buried into the adhesive layer 302 as shown in FIG. 3I. Thus, a circuit board having the interconnections on the both sides is completed. In this embodiment, aluminum foil is used for the supporting substrate 308 and copper foil (patterned) in 9 $\mu$m thickness is utilized for the interconnection layer 309.

Removing the supporting substrate 308 is performed by dissolving and removing the aluminum foil by selective etching between aluminum and copper foils. Other than selective etching, there is also a method of removing the supporting substrate 308 by heating with releasing foam sheet provided between the supporting substrate 308 and the interconnection layer 309. In this method, the supporting substrate 308 is not limited to the aluminum foil, and metal foil and metal plate of materials such as copper, stainless and the like may be utilized.

Further, in this embodiment, a multilayer interconnection board may be formed by treating the product prepared by the procedures of FIG. 3A to FIG. 3H as the interconnection layer 309 supported by the supporting substrate 308 in FIG. 3F and by repeating the procedures of FIG. 3F to FIG. 3H.

In accordance with this embodiment, fine through holes 306, for example, such as the diameter of 50 $\mu$m may be formed because holes are drilled by using a YAG solid-state laser radiating laser light with a short wavelength not longer than that in the ultraviolet range. Further, since the mask films 303 are formed by applying and drying a resin varnish 304, a change in dimension of the substrate in removing a mask film may be decreased compared with the case that mask films are formed by a laminating process. A higher density circuit board may be realized from these reasons.

Fourth Preferable Embodiment

FIG. 4 are sectional views of the steps illustrating a process for the manufacturing of a circuit board in the fourth preferred embodiment of the present invention.

At first, as shown in FIG. 4A, the removable mask films 402 are formed on the both sides of the porous insulating substrate the 401 having compressibility. The porous insulating substrate 401 is, for example, prepared as follows. That is, thermosetting resin is impregnated into nonwoven fabric utilizing organic fiber. Thereby, porous insulating substrate 404 having voids inside and compressibility is prepared. Then, thermosetting resin impregnated is brought to the half-cured condition. Materials described in the second embodiment may be used as organic fiber and thermosetting resin.

In this embodiment, nonwoven fabric impregnated with epoxy resin which uses aromatic polyamide fiber is used as the porous insulating substrate 401. And, a thickness of the porous insulating substrate 401 is 120 mm.

The mask film 402 is formed by the method that the resin varnish 403 is applied on the both sides of the porous insulating substrate 401 and dried. The resin varnish 403 is composed of at least a resin to be a principal component of the mask film 402, a ultraviolet-absorbing agent and solvent. Cellulosic, for example, such as nitrocellulose, acethyl cellulose, cellulose acetate, cellulose propionate, ethyl cellulose and the like may be used for a resin to be a principal component of the mask film 402.

When the mask film 404 is formed as a principal component of cellulosic, a ultraviolet-absorbing agent described in the first embodiment is added in such a way that hole drilling may be performed by using laser light with short wavelength of 400 nm or less in the range of wavelength not longer than that in the ultraviolet range. Further, as for solvent composing of the resin varnish 404, it is selected such a solvent that dissolves the principal component composing of the mask film 403 and the ultraviolet-absorbing agent but does not erode the porous insulating substrate 401. Transformation of the foregoing material mixed into varnish may be achieved by using in combination adequately dispersion equipment using a media such as a ball mill, a sand mill or the like, kneading equipment such as a pressure kneader, a planetary mixer or the like and mixing equipment such as a disper or the like. The concentration and the viscosity of the resin varnish 403 may be determined corresponding to a application means.

The method for applying the resin varnish 403 on the porous insulating substrate 401 is not limited, a publicly known method such as electrostatic coating, dip coating, spray coating, roller coating, doctor blade method, gravure method, die coating and screen printing etc may be adopted.

In the fourth embodiment, the resin varnish 403 is prepared by mixing and dispersing materials having the following compositions.

Ethyl cellulose (ETHOCEL STD100:Dow Chemical Company)

100 parts by weight

Ultraviolet-absorbing agent (JF-79: Johoku Chemical Co., Ltd.) 1 parts by weight Toluene 100 parts by weight Methanol 800 parts by weight The mask films 402 are formed by applying a resin varnish 403 on the both sides of the porous insulating substrate 401. The resin varnish 403 is applied by die coating using a die nozzle 404. A thickness of the mask films 402 is adjusted to 10 $\mu$m after it is formed in such a way and then dried. Drying is performed at a temperature required for releasing the solvent e.g. the order of 100° C. Futher, the ultraviolet-absorbing agent in this embodiment (JF-79: Johoku Chemical Co., Ltd.) is composed of 2-(2'-hydroxy-3'-tert-butyl-5'-methyl phenyl)5-chlorobenzotriazole to be a principal component.

Through holes 405 are in turn formed in the porous insulating substrate 401 provided with mask films 402 on both sides of the porous insulating substrate as shown in FIG. 4B. Through holes 405 are formed by laser processing.

In this embodiment, a third harmonics YAG solid-state laser radiating laser light with a wavelength of 351 nm not longer than that in the ultraviolet range is used to perform a fine hole drilling as well as the first embodiment described above. Through holes 405 of the diameter of 100 $\mu$m are formed by using such a technique.

Then, as shown in FIG. 4C, conductive paste 406 is filled into the through holes 405. In this embodiment, the conductive paste 406 is filled by printing the conductive paste 406 from on the mask film 402 by a screen printing machine. In this time, a resin ingredient in the conductive paste 406 within the through holes 405 is drawn by evacuating and absorbing through a porous sheet (not shown) such as Japanese paper and the like from the opposite side to the printed face under vacuum. The conductive paste 406 is increased in a percentage of a conductive element by this operation and further closely filled.

When such procedures are performed, the mask film 402 plays roles as a printing mask and a protector against contamination of the surface of the porous insulating substrate 401.

Then, as shown in FIG. 4D, the mask films 402 are removed from the both sides of the film 401. In this procedure, since the through holes 405 are as fine as a diameter of 100 $\mu$m, a phenomenon of "the paste being taken away" described in the first embodiment seldom occurs. Further in this time, a change of the dimensions of the porous insulating substrate 401 was within 10 $\mu$m relative to a reference distance of 60 mm after the mask filter 402 was removed.

While a change of the dimensions of film 101 was 30 to 50 $\mu$m relative to a reference distance of 60 mm in the second embodiment wherein the mask films 202 are formed on the both sides of the porous insulating substrate 201 by a laminating process, effects of residual strain like laminating process is almost never found and the dimensional accuracy is significantly improved in this embodiment wherein the mask films 402 are formed by applying and drying a resin varnish 403.

Then, as shown in FIG. 4E, copper foils 407 are overlaid respectively on the both sides of the porous insulating substrate 401. And, both of them overlaid are heated and pressurized. Heating and pressurizing is carried out, for example, by using vacuum press.

The conductive paste 406 is compressed and therefore a resin ingredient in the conductive paste 406 flows out into the porous insulating substrate 401 by these heating and pressurizing, as shown in FIG. 4F, and a conductive element in the conductive paste 406 is closely packed. Thus, the copper foils 407 which are located on the opposite sides of the porous insulating substrate 401 are electrically interconnected each other through the intermediary of conductive paste 406. Hereafter, the porous insulating substrate 401 and the conductive paste 406 are cured.

Then, as shown in FIG. 4G, the copper foil 407 is patterned into desired interconnection form using photolithography. In this embodiment, a foil in 18 μm thickness is utilized for the copper foil 407. Therefoe, a circuit board having the interconnections on the both sides is completed.

Further, in this embodiment, a multilayer interconnection board may be formed by treating the product prepared by the procedures of FIG. 4A to FIG. 4G as the copper foil on the one side in FIG. 4E and by repeating the procedures of FIG. 4E to FIG. 4G.

Fifth Preferable Embodiment

When drilling by laser processing, wastes resulting from that aramid prepreg substrate and removable mask film are melted by heat of laser and melting film shatter adhere on the surface of the removable film. When conductive paste is printed by squeezy under such a condition, said waste is readily involved into the through hole. As a result of analyzing the defective hole in actual, interconnection layer 107 removable film component was detected in the conductive paste within via hole contact portion. Even though drilling method is altered to the another such a machining using a drill, the result does not change.

Therefore, a plurality of removable films are laminated in this embodiment. And, the scraping described above is removed by removed only a superficial removable film after hole drilling and dust deposited on the surface of the mask film during procedures up to the procedure for forming the through hole is removed by removing a superficial removable film after hole drilling.

Hereinafter, a process for the manufacturing of the circuit board in this embodiment will be described. By the way, since this embodiment is essentially similar to the second embodiment except a composition of the removable mask film, the composition which is same as or similar to that of the second embodiment is designated with the similar symbol and the description on the composition will be omitted. FIG. 5 is sectional views illustrating characteristic steps in a process for the manufacturing of this embodiment.

Figure 5A:
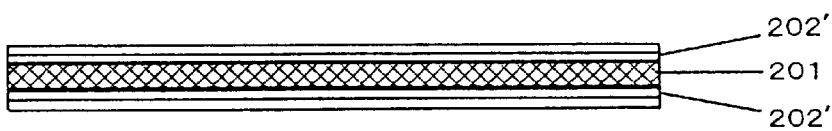
FIGS. 5A-5E are sectional views of the steps illustrating a process for the manufacturing of a circuit board in the fifth preferred embodiment of the present invention.
Figures 1, 5A:
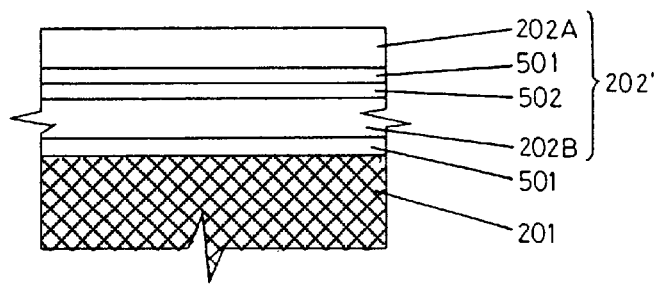

At first, as shown in FIG. 5A, laminated mask films 202' formed with releasing layer on one side are pasted to the both sides of the porous insulating substrate 201 by laminating process. A laminated mask film 202' is composed of two removable mask films 202A, 202B overlaid with adhesive layers interposed between two removable films.

An enlarged sectional view of portion "A" of FIG. 5A is shown in FIG. 5A-1. As illustrated in this view, a laminated mask film 202' is composed by laminating mask film 202A, a releasing layer 501, an adhesive layer 502, a mask film 202B and a releasing layer 501 in succession from the outer. A film of polyethylene naphthalate (PEN) and the like having absorptivity upon laser light with wavelength of 400 nm or less in the range of wavelength not longer than that in the ultraviolet range is used as mask films 202A, 202B.

Figure 5B:
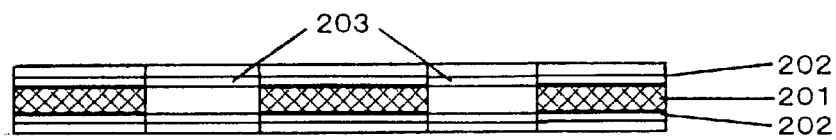

Through holes 203 are then formed in the porous insulating substrate 201 by laser processing as shown in FIG. 5B. In this embodiment, a third harmonics YAG solid-state laser radiating laser light with a wavelength of 351 nm being not longer than that in the ultraviolet range is used to perform a fine hole drilling as well as the first embodiment described above.

Figure 5C:
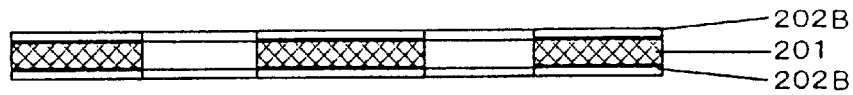

Further, as shown in FIG. 5C, a mask film 202A positioned outer side among mask films 202A, 202B composing a laminated mask film 202' is removed.

Figure 5D:
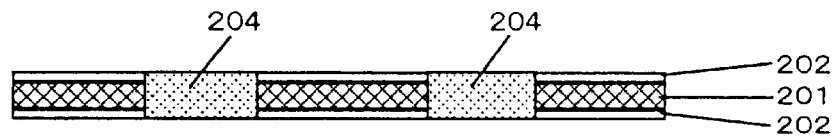

Then, as shown in FIG. 5D, conductive paste 204 is filled into the through holes 203. With filling method, for example, the conductive paste 204 is filled by printing directly from on the porous insulating substrate 201 by using a screen printing machine.

Figure 5E:

Then, as shown in FIG. 5E, mask film 202B left is removed from porous insulating substrate 201. Thereby, porous insulating substrate 201 filled with conductive paste 204 is obtained.

Since the following manufacturing procedure is similar to the second embodiment described taken in connection with FIG. 2E to FIG. 2G, description on these procedure will be omitted.

In this embodiment, a laminated mask film 202' comprising a plurality of layers of mask films 202A, 202B is laminated at least on the one surface of porous insulating substrate 201 of the side filled with conductive paste 204, and the superficial mask film 202A is removed after drilling the through holes 203. Thereby, the through hole 203 is protected from the waste generated during drilling the through hole 203 contaminating into the conductive paste 204. As a matter of course, a laminated mask films 202' provided on both sides of porous insulating substrate 201 like this embodiment allow to protect the waste contamination more effectively.

Further, in this embodiment, after the mask film 202' is laminated on both sides of the porous insulating substrate 201 respectively, the through hole 203 is drilled and further the superficial mask films 202a are removed from the both sides of the porous insulating substrate 201 respectively. Alternately, in this stage, removing the superficial removable mask film 202A may be limited to the side filled with conductive paste 204 and the superficial removable mask film 202A of the other side may also be left without removing.

Or, the laminated mask film 202' may laminated on the film side filled with conductive paste 204 and a single layer of removable mask film 202 may be laminated on the other side.

In this connection, it is needless to say that a process for manufacturing using laminated mask film 202' of this embodiment may be applied, in addition to this embodiment, for the first, the third and the fourth embodiments as well. With the applications for another embodiment, a method of laminating a laminated mask film which is previously laminated on a substrate or a method of laminating a single layer of mask film on a substrate and thereafter bonding another mask film to the substrate with single mask film in order by the application and the like are be able to be considered.

Further, though a laminated mask film 202' laminated with two removable mask film 202A, 202B is used in this embodiment, a laminated mask film laminated with three or more removable mask films may be used as well. For example, a laminated mask film laminated with three removable films through the medium of the adhesive is laminated on the porous insulating substrate 201. Thereafter, the through holes 203 are formed and after the most outer removable film is removed by one sheet, the conductive paste 204 is filled. And then, residual two sheet of the removable film mask are removed in order after the paste is filled. Thus, remaining amount (protruding amount) of conductive paste 204 filled into the through hole 203 and left in a configuration protruding through the surface of the porous insulating substrate 201 increases. When copper foil is laminated and pressurized under this condition, a degree of compression of the conductive paste 204 is increased.

Increase of a degree of compression of the conductive paste 204 allow to cause the connective resistance small and stable. For example, a laminated film laminated with two removable mask films in a thickness of 9 μm and similarly a laminated film laminated with one removable mask film in a thickness of 18 μm after the removal of the most outer removable mask are compared with each other.

Generally, when removable mask film is removed after the conductive paste is filled into the through hole, a part of the conductive paste within the through hole is take away according to "phenomenon of the paste being taken away" as a result of adhesion of the paste to the inner wall of the removable mask film hole. The amount of the paste taken away significantly increases as the contact area of the paste with the inner wall of the hole in the removable mask film increases.

Therefore, even when the overall thickness of removable mask films are equal to each other, when the removable mask film is removed separately two or more times through having a laminated structure as two layers, the overall amount of the paste taken away together with the removable mask film may decrease.

Of course, since the numbers of processing and the manufacturing cost increase as the numbers of the layer in the laminated mask film increases, it is better to determine the optimal numbers of the layer laminated considering the quality, the manufacturing cost and the manufacturing schedule managing.

A circuit board having the interconnections on the both sides of the board was manufactured according the procedures described in this embodiment. And, as a reference, A circuit board having the interconnections on the both sides of the board was obtained using a single layer of removable mask film according the procedures.

A prototyping conditions are as follows. A prepreg substrate prepared by impregnating aramid nonwoven fabric with epoxy resin is used as the porous insulating substrate 201. As removable mask film 202', in this embodiment, the laminated mask film 202' laminated with two removable mask film 202A, 202B comprising PEN film in thickness of 16 m formed with a releasing layer on the one side through the medium of the adhesive layer 502 was used.

In the reference, the single layer of removable mask film comprising a single PEN film in thickness of 16 µm formed with a releasing layer on the one side was used. The through hole is formed in diameter of 200 µm by laser processing. As the conductive paste, copper paste was used.

A circuit board in which a pitch of the drilled hole of the through hole 203 was varied in the four kinds of 0.4 mm, 0.8 mm, 1.2 mm, and 1.6 mm was manufactured.

With respect to the evaluation, the initial resistance value in connecting 500 via holes contact portions in series (sum of the resistance values of 500 via holes contact portions and lines) are measured and evaluated by the values and variations.

Figure 6:
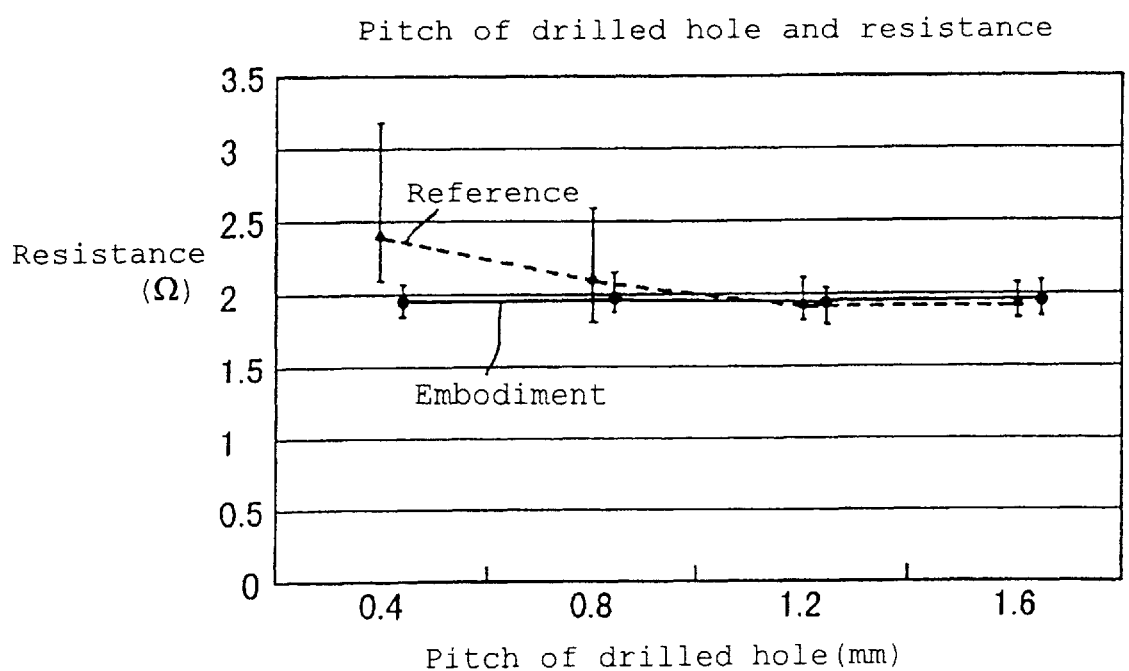
FIG. 6 is a graph showing measurements of resistance in varying a via hole pitch in a circuit board prepared in the fifth embodiment.

Measurements are shown in FIG. 6. In the case that a single layer of the removable mask film indicated by the dotted line is (reference embodiment case), the resistance value increases and the variations of the resistance is large as a pitch of the drilled via hole of the through hole becomes narrow. On the other hand, in the case that the removable mask film 202' is laminated on the one side shown by solid line (the present embodiment), a good results was obtained such that the resistance is constant independently the pitch of the drilled hole of the through hole 203 and the variations of the resistance is small.

In this embodiment, scraping generated in hole drilling and dust deposited during a processing may be protected from contaminating together with the paste in filling conductive paste 205 into the through hole 203. Therefore, a circuit board having via hole contact of low initial resistance and high interconnection reliability may be obtained. Furthermore, since at least one removable mask film 202B is left on the side of the substrate when a superficial removable film 202A is removed, the removable mask film 202B functions as a printing mask in filling the conductive paste 205 and therefore a surface of the substrate is not contaminated with the conductive paste 205.

Sixth Preferable Embodiment

A process for the manufacturing of the circuit board in this embodiment will be described. By the way, since this embodiment is basically similar to the second embodiment except a composition of the removable mask film, the composition which is same as or similar to that of the second embodiment is designated with the similar symbol and the description on the composition will be omitted. FIGS. 7A to 7E and 8A to 8C are sectional views illustrating each step of a process for the manufacturing in this embodiment.

Figure 7A:
FIGS. 7A-7E are sectional views of the steps illustrating the first half of steps of a process for the manufacturing of a circuit board in the sixth preferred embodiment of the present invention.

At first, as shown in FIG. 7A, the removable mask films 202 is formed on only the one side of the porous insulating the substrate 201 having compressibility.

The porous insulating substrate 201 similar to that of the second embodiment is used. That is, nonwoven fabric impregnated with epoxy resin which uses aromatic polyamide fiber is used as the porous insulating substrate 201. A thickness of the porous insulating substrate 201 is 120 µm.

The mask film 202 similar to that of the second embodiment is used. That is, a variety of film including, as an embodiment, polyethylene naphthalate (PEN) absorbing laser light with wavelength of 400 nm or less not longer than that in the ultraviolet range is used as mask films. The mask film 202 is provided with a silicon base releasing layer as required. And, a method of pasting the mask film 202 to the porous insulating substrate 201 is similar to the second embodiment.

Figure 7B:
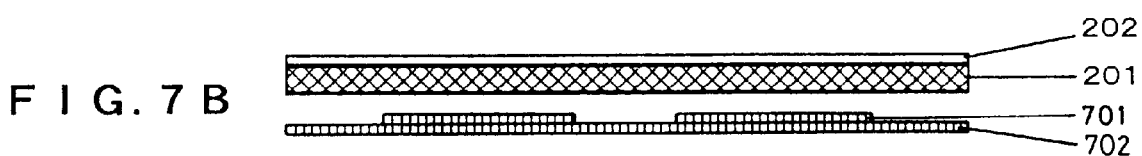

Then, as shown in FIG. 7B, a supporting substrate 702 including an interconnection layer 701 is overlaid on the other side (not formed with mask film 202) of the film 201. And, both of them overlaid is heated and pressurized. Heating and pressurizing is carried out, for example, by using vacuum press.

Figure 7C:
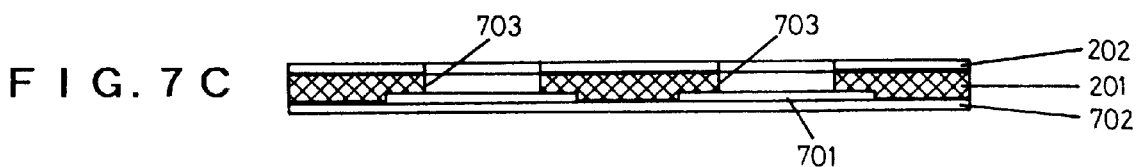

Base-blind holes 703 are in turn formed in the porous insulating substrate 201 provided with a mask film 202 by laser processing as shown in FIG. 7C. In this processing, base-blind holes 703 are formed by using a third harmonics YAG solid-state laser radiating laser light with a wavelength of 351 nm as well as the second embodiment described above. The base-blind hole 703 is formed inwardly from the face formed with mask film 202 to the inside of porous insulating substrate 201 in depth substantially equivalent to a thickness of porous insulating substrate 202. In this procedure, the base-blind hole 703 is aligned with the interconnection layer 701 and the formed. Thereby, base-blind hole 703 is formed in a configuration that the base-blind hole goes through the mask film 202 and porous substrate 201, and interconnection layer 701 is exposed at the base.

The porous insulating substrate 201 has a characteristic to absorb laser light with a wavelength in the ultraviolet range and a mask film 202 has also a characteristic to absorb laser light with a wavelength of 400 nm or less as described above. Therefore, base-blind holes 703 may be formed by using a third harmonics YAG solid-state laser light with a wavelength of 351 nm. In this embodiment, base-blind holes 703 holes of the diameter of 100 µm are formed by using a laser light as well as the second embodiment.

Figure 7D:
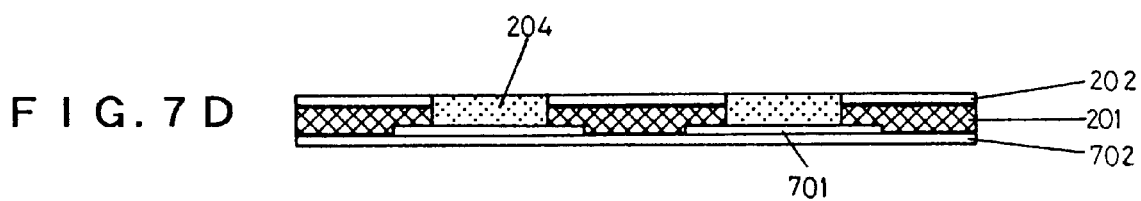

Then, as shown in FIG. 7D, conductive paste 204 is filled into the base-blind holes 703. In this embodiment, the conductive paste 204 is printed directly from on the mask film 202 by a screen printing machine.

When such procedures are performed, the mask film 202 plays roles as a printing mask and a protector against contamination of the surface of the porous insulating substrate 201.

Figure 7E:
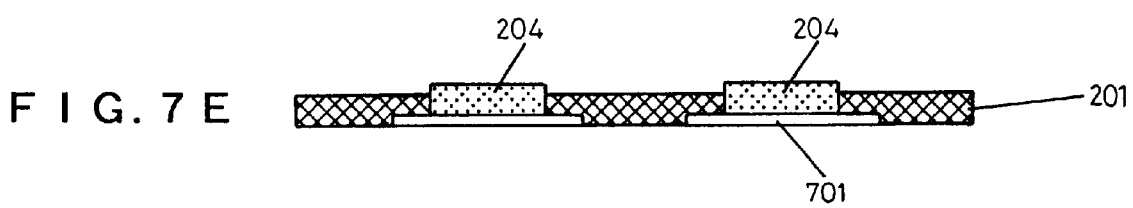

Then, as shown in FIG. 7E, the mask films 202 and the supporting substrate 702 are removed from the porous insulating substrate 201. In this procedure, since a diameter of the base-blind holes 703 are 100 μm, a phenomenon of "the paste being taken away" described in the first embodiment seldom occurs.

Figure 8A:
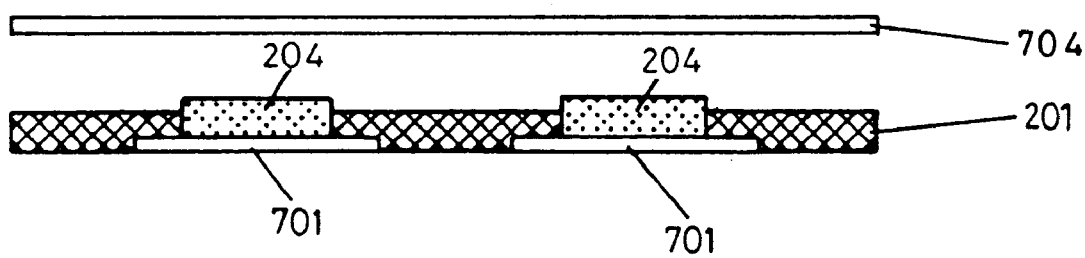
FIGS. 8A-8C are sectional views of the steps illustrating the latter half of steps of a process for the manufacturing of a circuit board in the sixth preferred embodiment of the present invention.

Then, as shown in FIG. 8A, copper foil 704 is overlaid on the one sides (side with the mask film removed) of the porous insulating substrate 201. And, both of them overlaid are heated and pressurized. Heating and pressurizing is carried out, for example, by using vacuum press.

Figure 8B:
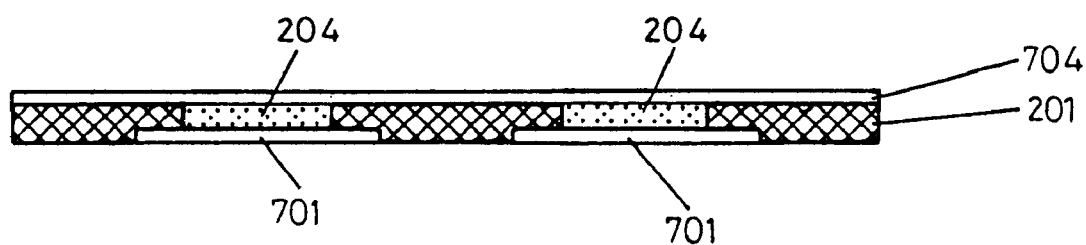

The conductive paste 204 within the base-blind holes 703 is compressed and therefore a resin ingredient in the conductive paste 204 flows out into the porous insulating substrate 201 by these heating and pressurizing, as shown in FIG. 8B. Thus, a conductive element in the conductive paste 204 is closely packed and the copper foils 704 and the interconnection layer 701 which are located on the opposite sides of the porous insulating substrate 201 are electrically interconnected each other through the intermediary of conductive paste 204. Hereafter, the porous insulating substrate 201 and the conductive paste 204 are cured.

Figure 8C:
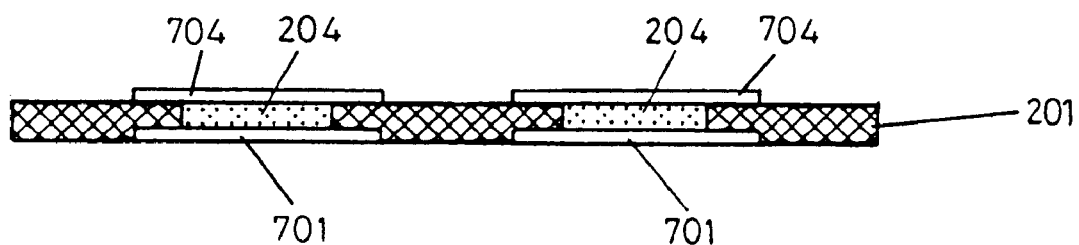

Then, as shown in FIG. 8C, the copper foil 704 is patterned into desired interconnection form using photolithography. Thus, a circuit board having the interconnections on the both sides is completed.

Removing the supporting substrate 702 is performed by dissolving and removing the aluminum foil by selective etching between aluminum and copper foils. Other than selective etching, there is also a method of removing the supporting substrate 702 by heating with releasing foam sheet provided between the supporting substrate 702 and the interconnection layer 701. In this method, the supporting substrate 702 is not limited to the aluminum foil, and metal foil and metal plate of materials such as copper, stainless and the like may be utilized.

Further, in this embodiment, a multilayer interconnection board may be formed by treating the product prepared by the procedures of from FIG. 7A to FIG. 7E and from FIG. 8A to FIG. 8C as the supporting substrate 702 with the interconnection layer in FIG. 7B and by repeating the procedures of from FIG. 7B to FIG. 7E and from FIG. 8A to FIG. 8C.

In this embodiment, because the base-blind hole 703 is formed against porous insulating substrate 201 laminated an located on the interconnection layer 701 toward interconnection layer 701, alignment between the interconnection layer 701 and the base-blind hole 703, therefore, alignment between the interconnection layer 701 and conductive paste 704 has a high degree of precision.

Figure 9:
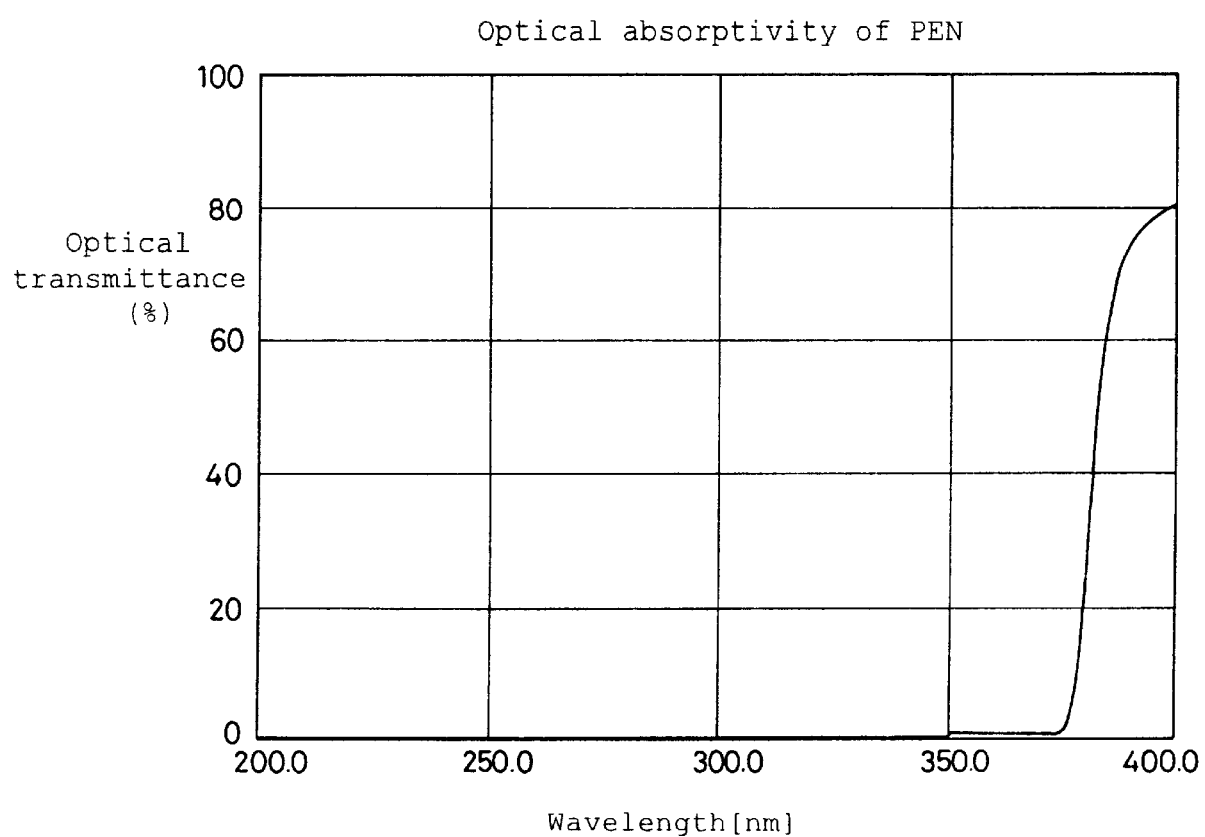
FIG. 9 is a graph showing optical absorptivity of polyethylene naphthalate (PEN)
Figure 10:
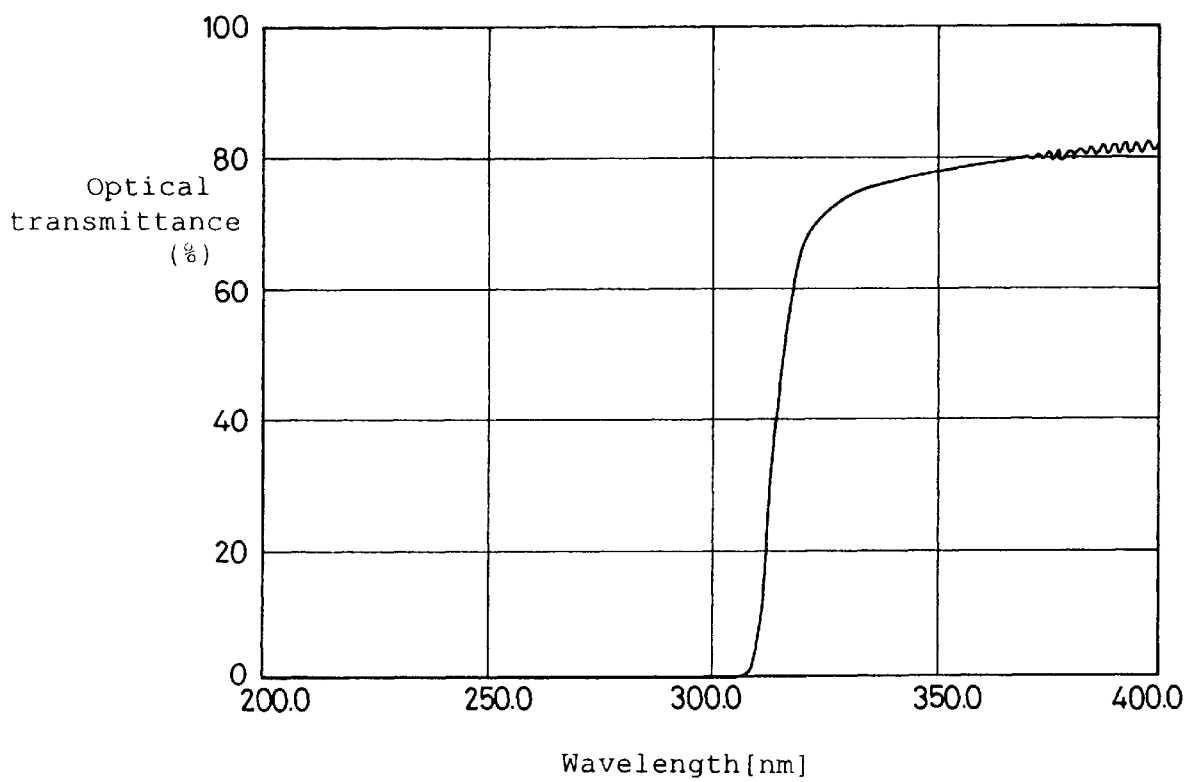
FIG. 10 is a graph showing optical absorptivity of polyethylene terephthalate (PET)
Figure 11:
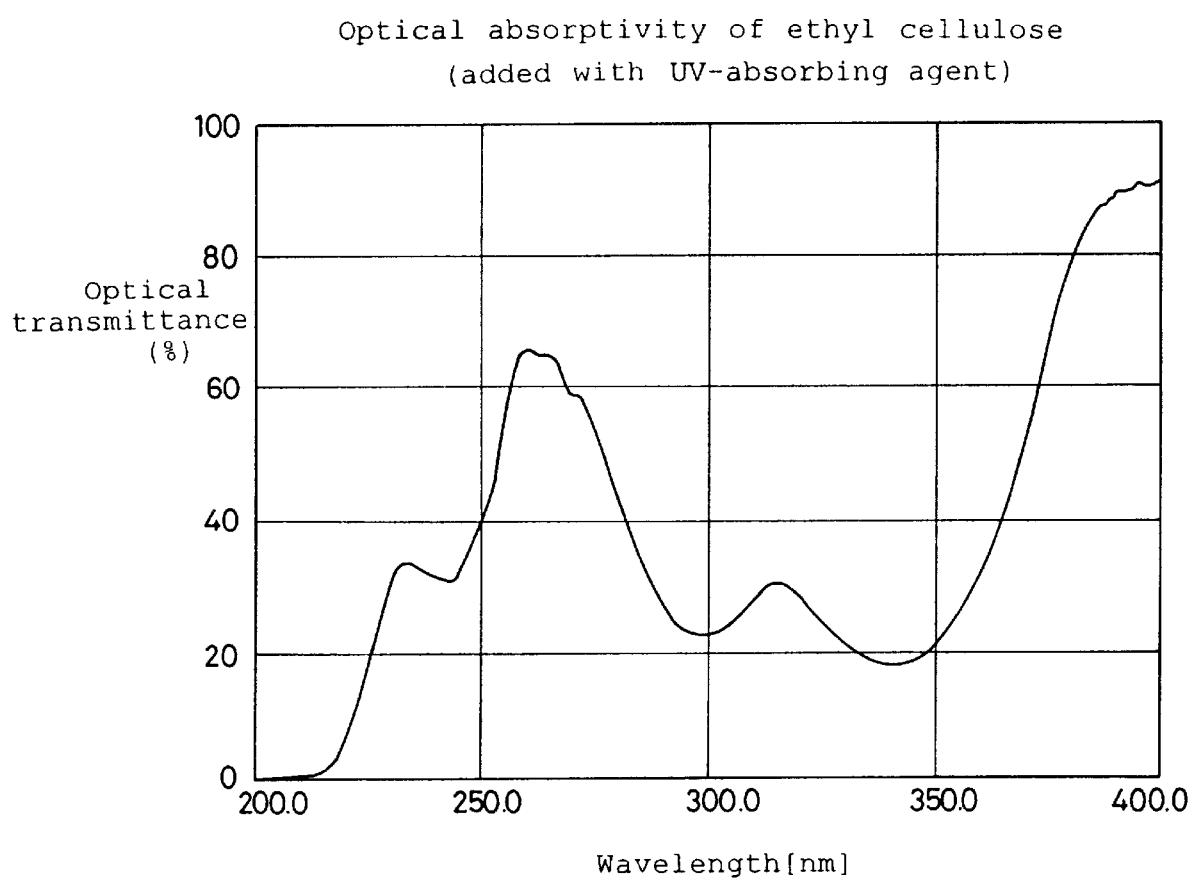
FIG. 11 is a graph showing optical absorptivity of ethyl cellulose added with a ultraviolet-absorbing agent.
Figure 12:
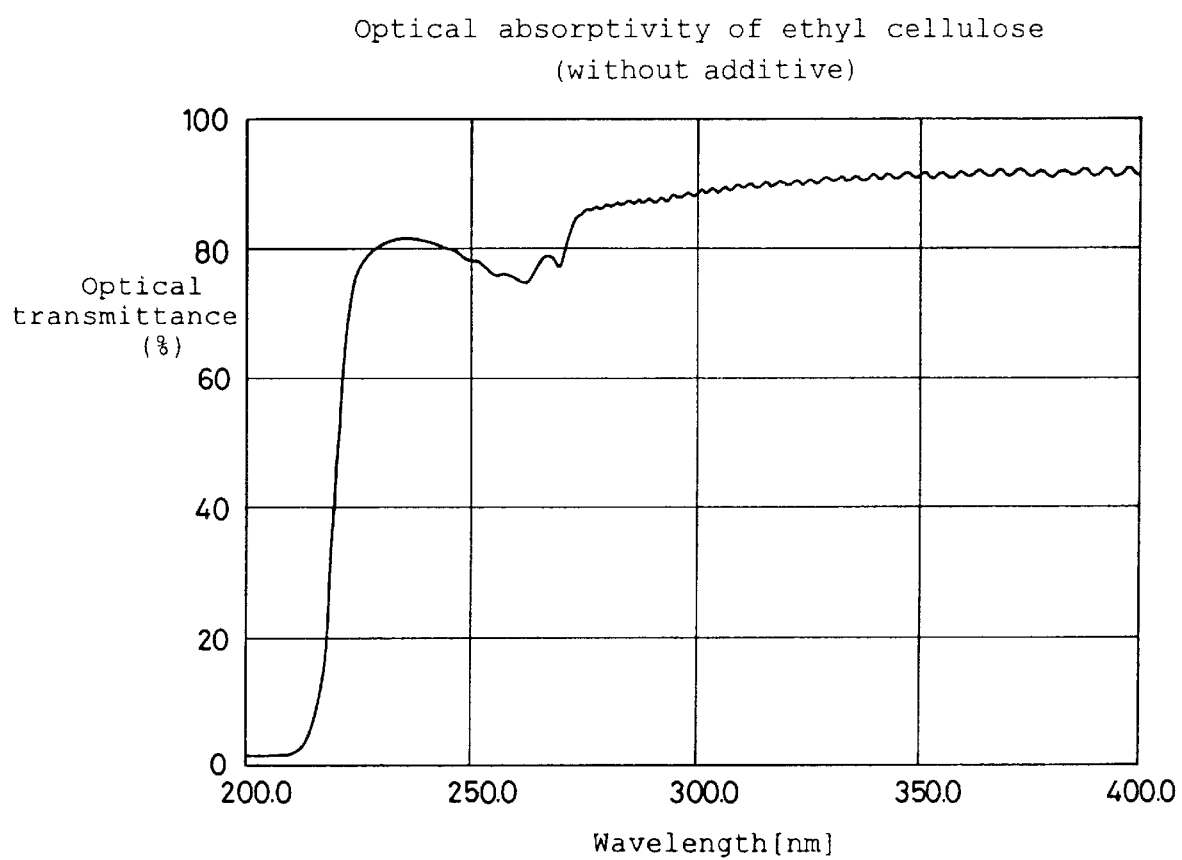
FIG. 12 is a graph showing optical absorptivity of a single substance of ethyl cellulose.

Then, optical absorptivity upon laser light of wavelength not longer than that in the ultraviolet range, which is specified in selecting a removable film in each embodiment, will be described. FIGS. 9 to 12 are graphs indicating optical absorptivity of each specimen upon laser light with a wavelength of 351 nm radiated by a third harmonics YAG solid-state laser: FIG. 9 shows optical absorptivity of polyethylene naphthalate (PEN); FIG. 10 shows optical absorptivity of polyethylene terephthalate (PET); FIG. 11 shows optical absorptivity of species in which a ultraviolet-absorbing agent (JF-77: Johoku Chemical Co., Ltd.: Addition rate 1 part by weight) is added to ethyl cellulose; and FIG. 12 shows optical absorptivity of a single substance of ethyl cellulose. In these drawings, a lateral axis and a vertical axis indicate wavelength and optical transmittance, respectively.

As it is apparent from these Figures, polyethylene terephthalate (PET) has optical transmittance of 80% and does not show sufficient optical absorptivity. On the other hand, polyethylene naphthalate (PEN) shows high optical absorptivity. And, a single substance of ethyl cellulose does not show optical absorptivity. On the other hand, ethyl cellulose added with a ultraviolet-absorbing agent shows good optical absorptivity to obtain sufficiently the effects of the present invention.

Further, as it is apparent from these Figures, removable mask film has preferably optical transmittance of at most 40% or less upon laser light in a range of wavelength not longer than that in the ultraviolet range for exerting effects of the present invention.

As described above, in each embodiment of the present invention, removable mask film having a characteristic to absorb laser light of wavelength not longer than that in the ultraviolet range is used. Thus, hole drilling may be performed by using laser light having a relatively short wavelength not longer than that in the ultraviolet range in which laser beam is easy to focus more. Therefore, fine hole drilling may be performed and a high density circuit board having a fine via hole may be realized.

Further, since the removable mask films are formed on at least the one side of the substrate by applying and drying a resin varnish, a change in dimension of the substrate in removing a removable film may be decreased compared with the case that removable mask films are formed on the substrate by a laminating process, and thus a high density circuit board with a high dimensional accuracy may be realized.

In each embodiment described above, hole drilling is performed by using YAG solid-state laser but the type of laser is not limited to using YAG solid-state laser. Any type of laser which has a wavelength not longer than that in the ultraviolet range, for example, excimer laser or others may be used for drilling.

Though, in each embodiment described above, it has been described about an embodiment of applying for a process for manufacturing of the circuit board with interstitial via hole contact performed by conductive paste, the removable film of the present invention may be applied for a process for manufacturing of another circuit board.

Though the mask films are formed on both sides of the substrate in each embodiment described above, they may be formed on only the one side of the substrate.

While the present invention has been described in detail in connection with the most preferred embodiment, various modifications of combination and arrangement of the components in the preferred embodiments may be made without departing from the spirit and scope of the present invention claimed hereinafter.

What is claimed is:

1. A removable film having:
    removability wherein said removability enables said film to be removed from a substrate after said film is drilled by laser light along with said substrate with said film provided on a surface of said substrate; and
    optical absorptivity absorbing laser light in a range of wavelength not longer than that in the ultraviolet range.

2. The removable film as set forth in claim 1, wherein said wavelength not longer than that in the ultraviolet range is a wavelength of 400 nm or less.

3. The removable film as set forth in claim 1, wherein said optical absorptivity is specified by a condition of optical transmittance of 40% or less.

4. The removable film as set forth in claim 1, wherein said removable film is used as a protective mask when a conductive element is filled into a drilled hole formed in said substrate by said drilling.

5. The removable film as set forth in claim 1, wherein said removable film contains a ultraviolet-absorbing agent.

6. The removable film as set forth in claim 1, wherein said removable film is predominantly composed of cellulosic.

7. The removable film as set forth in claim 6, wherein said cellulosic are nitrocellulose, acethyl cellulose, cellulose acetate, cellulose propionate and ethyl cellulose.

8. The removable film as set forth in claim 1, wherein said removable film is predominantly composed of polyethylene naphthalate (PEN), polyamide or polyimide.

9. A substrate with film comprising:
a substrate drilled on a surface of said substrate by laser light; and
a removable film provided on a surface of a substrate and removed from said substrate after hole drilling by said laser light;
wherein said removable film have optical absorptivity absorbing laser light in a range of wavelength not longer than that in the ultraviolet range.

10. The substrate with film as set forth in claim 9, wherein said wavelength not longer than that in the ultraviolet range is a wavelength of 400 nm or less.

11. The substrate with film as set forth in claim 9, wherein said optical absorptivity is specified by a condition of optical transmittance of 40% or less.

12. The substrate with film as set forth in claim 9, wherein said substrate is a film substrate having optical absorptivity absorbing laser light of wavelength not longer than that in the ultraviolet range and adhesion.

13. The substrate with film as set forth in claim 9, wherein said substrate is a porous substrate having optical absorptivity absorbing laser light of wavelength not longer than that in the ultraviolet range and compressibility.

14. The substrate with film as set forth in claim 9, wherein said removable film contain an ultraviolet-absorbing agent.

15. The substrate with film as set forth in claim 9, wherein said removable film are predominantly composed of cellulosic.

16. The substrate with film as set forth in claim 15, wherein said cellulosic are nitrocellulose, acethyl cellulose, cellulose acetate, cellulose propionate and ethyl cellulose.

17. The substrate with film as set forth in claim 9, wherein said removable film are predominantly composed of polyethylene naphthalate (PEN), polyamide or polyimide.

18. The substrate with a film as set forth in claim 9, wherein said a plurality of removable films are laminated and provided on said substrate.

* * * * *